(12) United States Patent
Kim

(10) Patent No.: US 6,351,368 B1
(45) Date of Patent: Feb. 26, 2002

(54) LEAD-THROUGH TYPE FILTER WITH BUILT-IN RECTANGULAR ELEMENTS

(75) Inventor: Sung Youl Kim, Goonpo (KR)

(73) Assignee: Expantech. Co., Ltd., Kyoungki-do (KR)

( * ) Notice: Subject to any disclaimer, the term of this patent is extended or adjusted under 35 U.S.C. 154(b) by 0 days.

(21) Appl. No.: 09/556,191

(22) Filed: Apr. 21, 2000

(30) Foreign Application Priority Data

Apr. 23, 1999 (KR) .............................................. 99-14589
Jun. 15, 1999 (KR) .............................................. 99-22218
Mar. 28, 2000 (KR) .......................................... 2000-15724

(51) Int. Cl.[7] ................................................ H01G 4/35
(52) U.S. Cl. ...................... 361/302; 361/309; 361/321.2
(58) Field of Search .............................. 361/302, 301.3, 361/301.4, 303, 304, 307, 309, 311; 333/182, 183, 184, 185; 338/230.21, 235, 323, 324

(56) References Cited

U.S. PATENT DOCUMENTS

| | | | | |
|---|---|---|---|---|
| 4,148,003 A | * | 4/1979 | Colburn et al. | ............. 333/181 |
| 5,546,058 A | * | 8/1996 | Azuma et al. | ............... 333/183 |
| 5,729,425 A | * | 3/1998 | Fujiwara et al. | ............. 361/305 |
| 5,896,267 A | * | 4/1999 | Hittman et al. | .............. 361/302 |
| 5,999,398 A | * | 12/1999 | Makl et al. | .................. 361/302 |

* cited by examiner

Primary Examiner—Anthony Dinkins
(74) Attorney, Agent, or Firm—Renner, Otto, Boisselle & Sklar, LLP

(57) ABSTRACT

A lead-through type filter used in a dc line for removing noises is disclosed. The lead-through type filter having angular elements according to the present invention includes a case 25 to be used as an external grounding terminal. A central conductive line 21 supplies a dc power and serves as IN/OUT terminals. At least one angular filtering element made of an angular ceramic stock is accommodated within the case. One side electrode is attached on a face of the ceramic stock and is electrically connected to the case 25. Another side electrode is attached on another face of the ceramic stock and is electrically connected to the central conductive line 21. An epoxy resin is filled into the interior of the case 25. Instead of the conventional lead-through type capacitor, polygonal capacitors are used in the present invention, and therefore, the capacitance control becomes easy, while the errors can be minimized. Further, the voltage withstanding characteristic is improved, and the workability is also improved during the manufacture.

30 Claims, 20 Drawing Sheets

13

LEAD-THROUGH TYPE FILTER WITH BUILT-IN RECTANGULAR ELEMENTS

BACKGROUND OF THE INVENTION

1. Field of the Invention

The present invention relates to a lead-through type filter used in a dc line for removing noises. Particularly, the present invention relates to a lead-through type filter with a built-in rectangular element, in which instead of the conventional lead-through type capacitor, the capacitor of the lead-through type filter of the present invention is made polygonal, so that the capacitance of the capacitor can be easily managed, that the errors can be minimized, that the voltage withstanding capability is made high, and that the workability can be improved.

2. Description of the Prior Art

Generally, EMI (electro magnetic interference) noise filter can be classified based on the functions into: a low pass filter (LPF) for passing only low bands; a high pass filter (HPF) for passing only high bands; a band pass filter (BPF) for passing only a particular band; and a band rejection filter (BRF) for removing only a particular band. Further, the filters can be classified based on the constituent elements into: a passive filter composed of a combination of passive elements such as inductor, capacitor and varistor; and an active filter composed of a combination of an active element such as transistor and passive elements such as capacitor and varistor.

The general lead-through type filter which is illustrated in FIG. 1 belongs to a low pass filter if it is classified functionally, and belongs to an EMI filter if it is classified constitutionally. Such a lead-through type filter is composed of a combination of a lead-through type inductor and a lead-through type capacitor, and depending on the combinations of the elements, the filter can be formed into an a π type, T type, or LC noise filter.

Meanwhile, the noises of various frequencies which are generated in the oscillations of the communication facilities, the broadcasting facilities and the magnetrons are released through the power supply line to be propagated into the space, and to cause noises and malfunctions in the surrounding apparatuses. The lead-through type filter is used to eliminate the noises which are released through the power supply line.

FIG. 2 is a longitudinal sectional view showing the internal constitution of the conventional lead-through type filter. Referring to FIG. 2, this conventional lead-through type filter includes a lead-through type capacitor and a lead-through type inductor, or includes only a lead-through type capacitor. That is, within a case 15 which serves as a ground terminal, a lead-through type inductor 12 made of a ferrite magnetic material and a lead-through type capacitor 13 made of a ceramic material are installed on a conductive line 11 which passes through the mentioned elements 12 and 13. Further, an epoxy resin 14 is coated on the whole device. Further, IN/OUT terminals extend to the outside of the case 15, while the case 15 is grounded to be installed on a circuit board.

As to the manufacturing process for this lead-through type filter, first the lead-through type inductor 12 and the lead-trough type capacitor 13 are manufactured. Then a conductive line 11 is made to pass through the lead-through type inductor 12 and the lead-through type capacitor 13. Then the conductive line 11 is soldered to an internal electrode 13c of the lead-trough type capacitor 13. Then the cylindrical case 15 is fitted to it, and the case 15 is soldered to an external electrode 13b of the lead-through type capacitor 13. Then the epoxy resin 14 is filled into a vacant space within the cylindrical case 15. As shown in the equivalent circuit of FIG. 4, this lead-through type filter serves as an LC low pass filter. In FIG. 5, reference code 27 indicates an electrically connected portion such as a soldered portion.

As shown in FIGS. 3a and 3b, in the lead-through type (cylindrical type) capacitor, its external circumferential surface form the external electrode 13b to be bypassingly grounded, while its internal circumferential surface form an internal electrode 13c to serve as a dc line terminal.

However, in this conventional lead-through type filter, there are roughly three problems due to the lead-through type capacitor. First, the error control becomes difficult due to the geometric contour of the lead-through type capacitor. Second, the manufacturing work becomes fastidious due to its geometric contour. Third, the thicknesses between the external and internal circumferences are not constant, and therefore, the voltage withstanding capability which is based on the thinner portion is weak. These will be described in detail below.

First the difficulty of controlling the errors will be described. In this conventional lead-through type capacitor, regardless of the step of the external circumferential surface, the external and internal circumferential surfaces are round, and there is a great difference between the areas of the two surfaces. Therefore, the capacitance management which directly affects the filtering band of the capacitor becomes difficult. Accordingly, the error control among the products becomes difficult. Therefore, if an error occurs in the form of a too large a capacitance, one end of the lead-through type capacitor is trimmed, thereby attaining to the desired capacitance value. On the other hand, if an error occurs in the form of too small a capacitance, then the product is discarded as a defective one.

Second, the manufacturing difficulty will be described. In the conventional lead-through type capacitor of the filter as shown in FIG. 3, a specially prepared die is used to manufacture the stepped external electrode of the capacitor, and therefore, the manufacturing process is difficult. Further, the diameter of the internal electrode of the capacitor has to be varied according to the diameter of the conductive line used, thereby making the manufacture difficult. Further, the electrical connection between the conductive line and the internal electrode of the capacitor has to be done by carrying out a cream-soldering into the tiny gap between the conductive line and the internal electrode of the capacitor, thereby making it difficult to manufacture the lead-through type capacitor.

Finally, the weakness of the voltage withstanding will be described, If a voltage surge occurs, an insulator breakdown can occur due to the small thickness between the external and internal electrodes of the capacitor.

SUMMARY OF THE INVENTION

The present invention is intended to overcome the above described disadvantages of the conventional technique.

Therefore it is an object of the present invention to provide a lead-through type filter with a built-in rectangular element, in which instead of the conventional lead-through type capacitor, the capacitor of the lead-through type filter is made polygonal, so that the capacitance of the capacitor can be easily managed, that the errors can be minimized, that the voltage withstanding capability is made high, and that the workability can be improved.

It is another object of the present invention to provide a lead-through type filter with a built-in rectangular element, in which the lead-through type filter having the polygonal capacitor is manufactured in an array form, so that the workability can be improved, the manufacture can be made simple, and the material used can be saved, thereby curtailing the manufacturing cost.

In achieving the above objects, the lead-through type filter having angular elements according to the present invention includes: a case to be used as an external grounding terminal; a central conductive line for supplying a dc power; at least one angular filtering element accommodated within the case and made of an angular ceramic stock, with one side electrode being attached on a face of the ceramic stock and being electrically connected to the case, and with another side electrode being attached on another face of the ceramic stock and being electrically connected to the central conductive line; and an epoxy resin layer filled into an interior of the case.

In another aspect of the present invention, the lead-trough type filter having angular elements according to the present invention includes: a multi-case having at least two element accommodating rooms and to be used as an external grounding terminal; a central conductive line for supplying a dc power; at least one angular filtering element made of an angular ceramic stock, with one side electrode being attached on a face of the ceramic stock and being electrically connected to the element accommodating rooms of the multi-case, and with another side electrode being attached on another face of the ceramic stock and being electrically connected to the central conductive line, so as to be accommodated within the element accommodating rooms of the multi-case; and an epoxy resin layer filled into an interior of the multi-case.

BRIEF DESCRIPTION OF THE DRAWINGS

The above objects and other advantages of the present invention will become more apparent by describing in detail the preferred embodiment of the present invention with reference to the attached drawings in which:

FIG. 12b is an equivalent circuit of FIG. 12a;

FIG. 13b is an equivalent circuit of FIG. 13a;

FIG. 14b is an equivalent circuit of FIG. 14a;

FIG. 15b is an equivalent circuit of FIG. 15a;

DETAILED DESCRIPTION OF THE PREFERRED EMBODIMENTS

The present invention will be described in detail referring to the attached drawings.

In the lead-through type filter having polygonal filtering elements according to the present invention, at least a polygonal capacitor is used so that the capacitance of the capacitor can be easily managed, that the errors can be minimized, that the voltage withstanding capability can be made high, and that the workability can be improved. Accordingly, the noises can be effectively removed at the desired band. Further, inductors and angular or polygonal capacitors can be arrayed in an easy manner, and in accordance with the array method, a π T type, T type or LC noise filter can be easily manufactured. Further, a plurality of the lead-through type filters can be formed within a single case in an array form, thereby curtailing the manufacturing cost.

Figure 1:
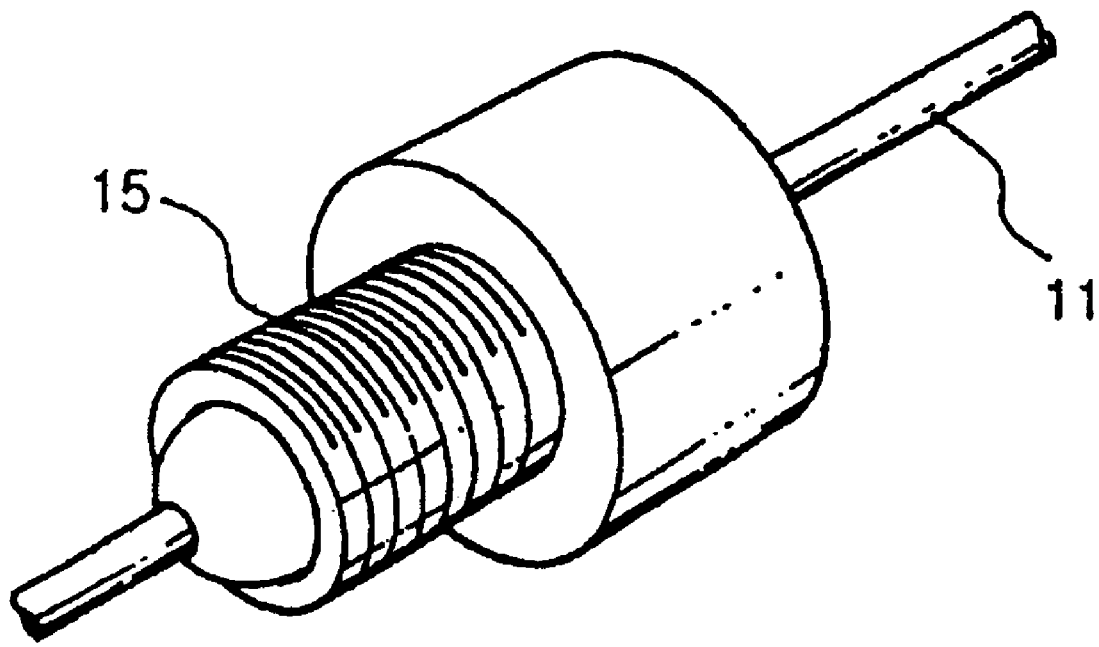
FIG. 1 is a perspective view of the general lead-through type filter.
Figure 2:
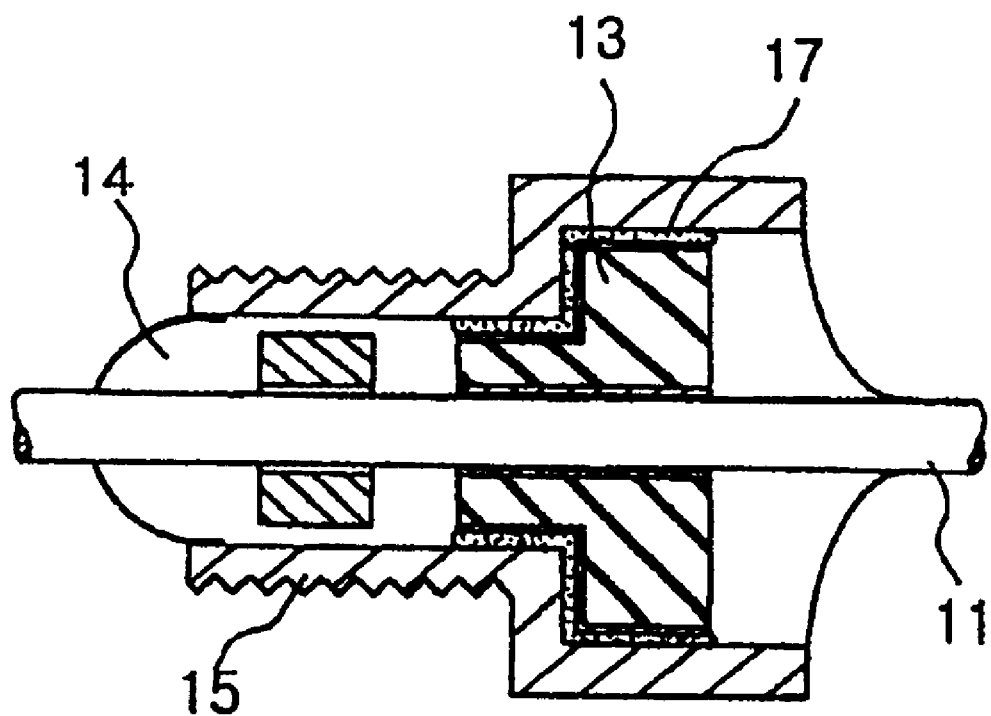
FIG. 2 is a longitudinal sectional view showing the internal constitution of the conventional lead-through type filter.
Figure 3A:
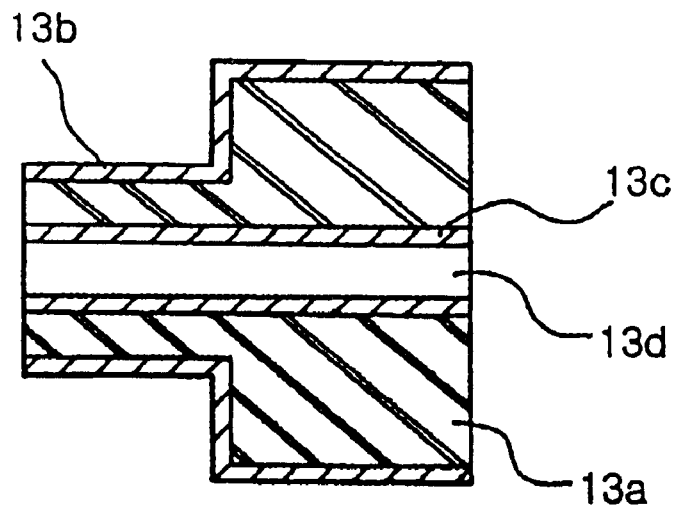
FIG. 3 is a longitudinal sectional view showing the internal constitution of the conventional lead-through type capacitor.
Figure 3B:
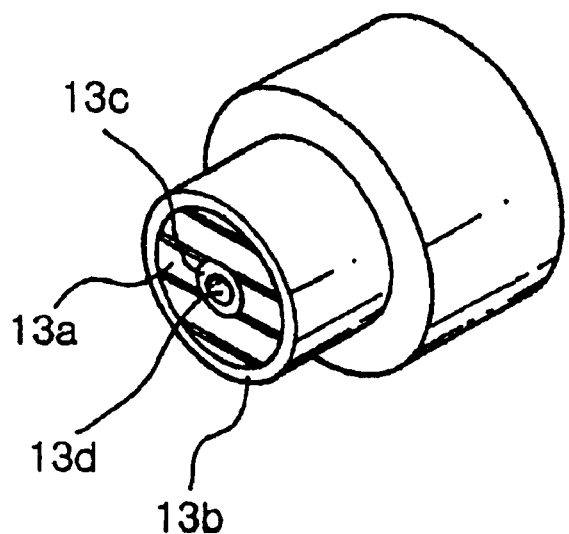
Figure 4:
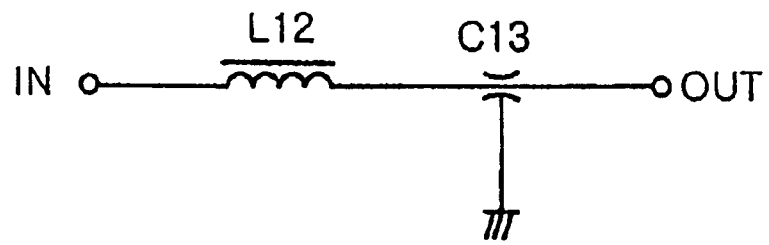
FIG. 4 is a perspective view of the lead-through type capacitor of FIG. 2.
Figure 5:
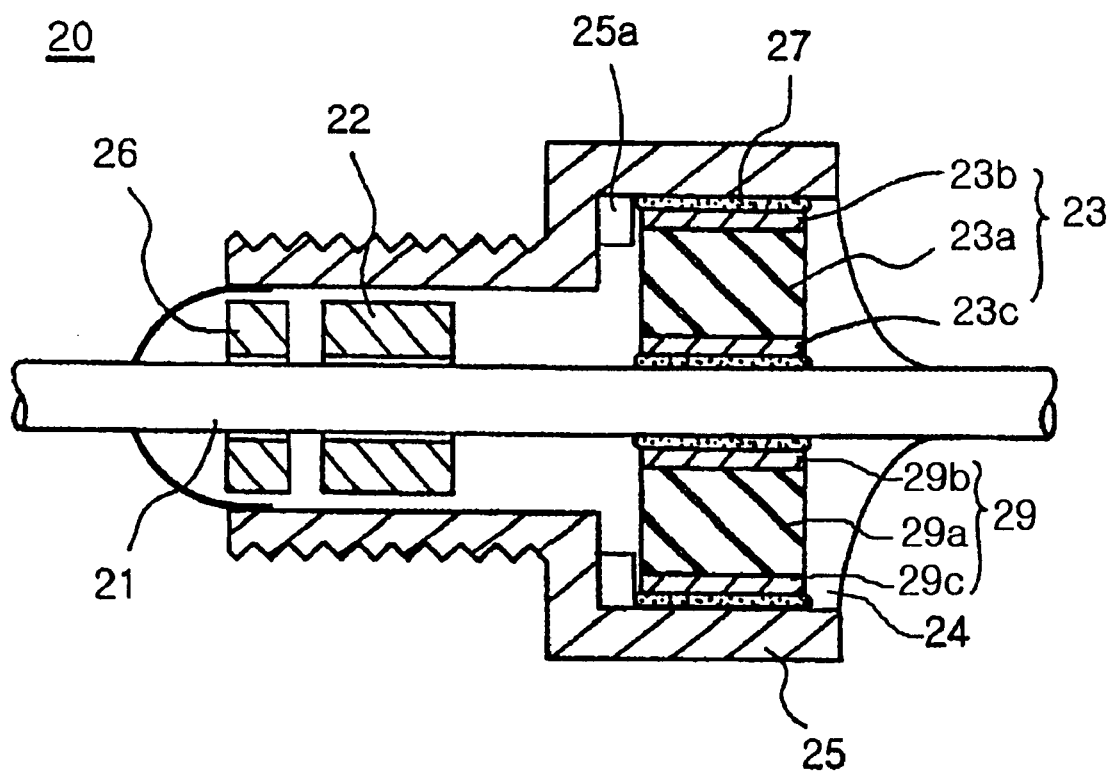
FIG. 5 is a longitudinal sectional view showing the internal constitution of a first embodiment of the lead-through type filter according to the present invention.
Figure 6:
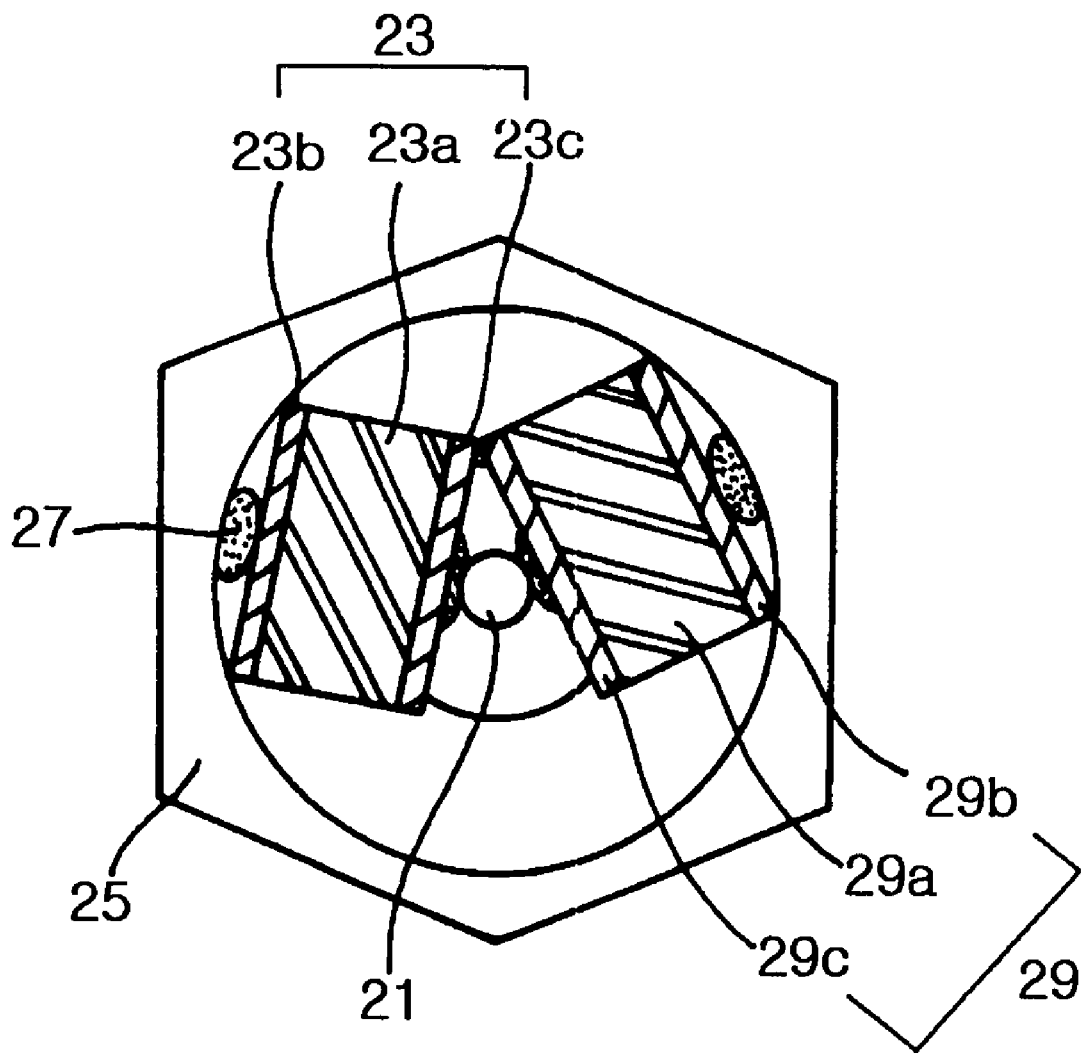
FIG. 6 is a plan view of the filter of FIG. 5.

FIG. 5 is a longitudinal sectional view showing the internal constitution of a first embodiment of the lead-through type filter according to the present invention. FIG. 6 is a plan view of the filter of FIG. 5. Referring to FIGS. 5 and 6, the lead-trough type filter having angular elements according to the present invention includes: a case 25 to be used as an external grounding terminal; a central conductive line 21 for supplying a dc power and serving as IN/OUT terminals; at least one angular filtering element accommodated within the case and made of an angular ceramic stock, with one side electrode being attached on a face of the ceramic stock and being electrically connected to the case 25, and with another side electrode being attached on another face of the ceramic stock and being electrically connected to the central conductive line 21; and an epoxy resin layer 24 filled into an interior of the case 25.

Figure 11A:
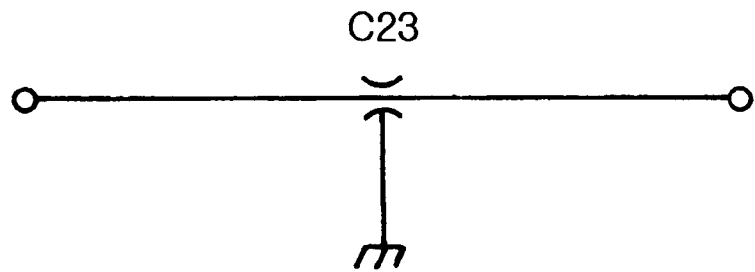
FIGS. 11a, 11b and 11c are equivalent circuits of the filter of FIG. 5.

The case 25 includes a large diameter interior space, and a small diameter interior space. A filtering element which is accommodated within the large diameter interior space of the case 25 is an angular ceramic stock 23a. A one side electrode 23*b* is attached on one face of the ceramic stock and is electrically connected to the inside of the case 25. Another side electrode 23*c* is attached to another face of the ceramic stock and is electrically connected to the central conductive line 21. Thus within the large diameter interior space of the case 25, there is accommodated at least one angular capacitor 23. For example, in the case where one single angular capacitor is provided, the equivalent circuit is as shown in FIG. 11*a*. In this equivalent circuit, a capacitor C23 is for removing the noises.

The filtering element is accommodated within the large diameter interior space of the case 25. This filtering element which is accommodated within the large diameter interior space of the case 25 is an angular ceramic stock 29*a*. A one side electrode 29*b* is attached on one face of the ceramic stock and is electrically connected to the inside of the case 25. Another side electrode 29*c* is attached to another face of the ceramic stock and is electrically connected to the central conductive line 21. Thus within the large diameter interior space of the case 25, there is accommodated at least one angular varistor 29.

Figure 11B:
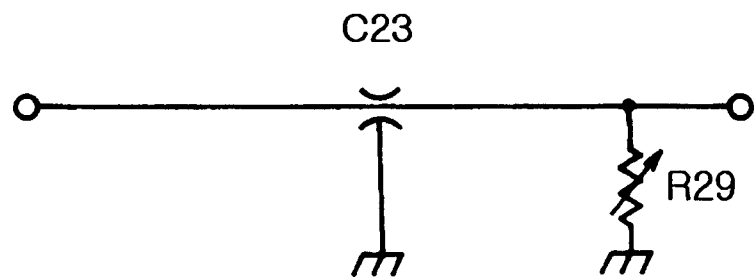

The filtering elements may include at least one angular capacitor and at least one angular varistor. For example, in the case where one angular capacitor and one angular varistor are provided, the equivalent circuit is as shown in FIG. 11*b*. In this equivalent circuit, a capacitor C23 removes the noises, while a varistor R29 blocks any over-voltage or over-current due to a surge, thereby protecting the applied apparatus.

Figure 11C:
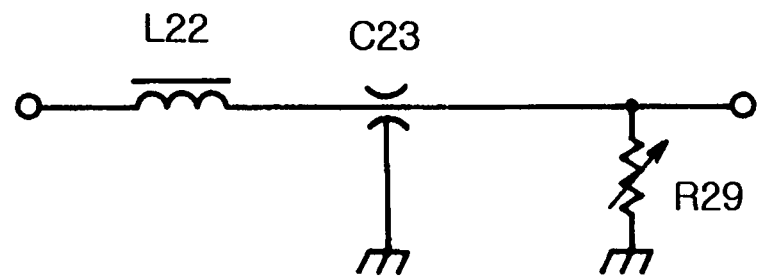

Further, the lead-through type filter may include a cylindrical ferrite magnetic body (major ingredients: NiO, ZnO, Fe) having an axial through hole, thereby forming at least one lead-through type inductor 22. The conductive line 21 is inserted through the axial through hole of the magnetic body, and the magnetic body is accommodated within the small diameter interior space of the case 25. For example, in the case where the filter includes one angular capacitor, one angular varistor and one inductor, the equivalent circuit is as shown in FIG. 11*c*. In this equivalent circuit, the capacitor C23 and the inductor L22 remove noises, while the varistor R29 blocks any over-voltage or over-current due to a surge or the like.

Figure 9A:
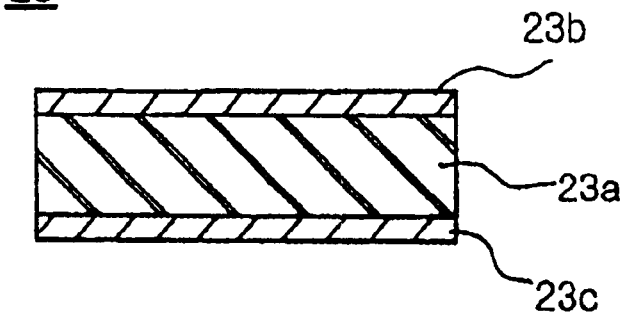
FIG. 9a is a side view of the angular capacitor of FIG. 5.
Figure 9B:
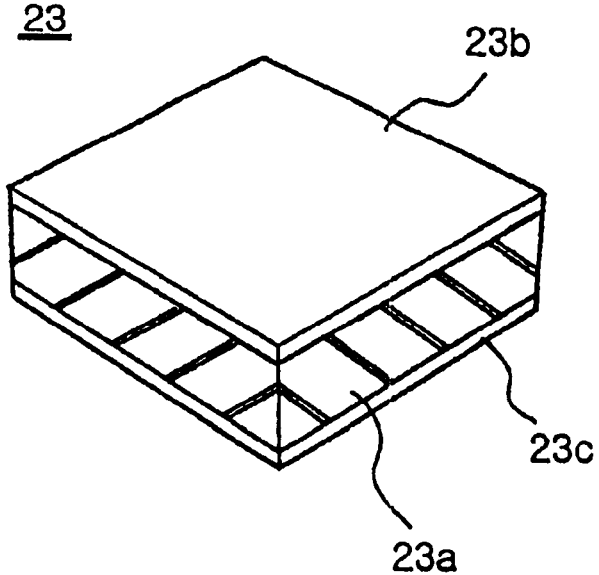
FIG. 9b is a perspective view of the angular capacitor of FIG. 5.
Figure 10A:
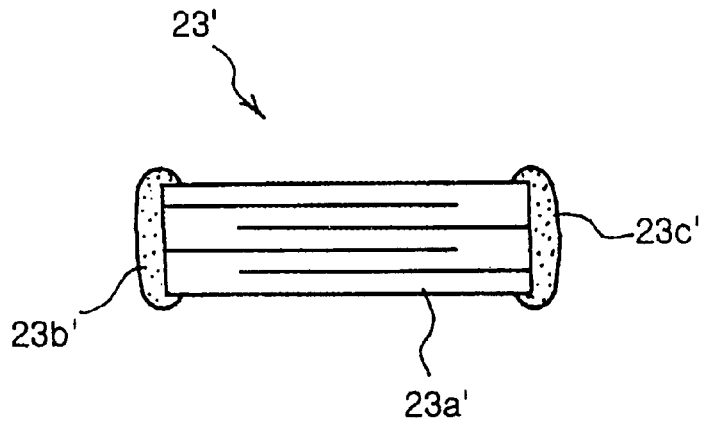
FIG. 10a is a side view of the stacked type capacitor of FIG. 5.
Figure 10B:
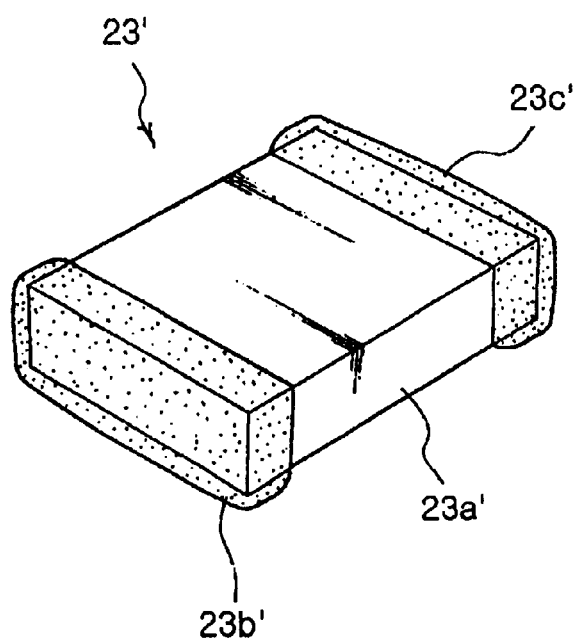
FIG. 10b is a perspective view of the stacked type capacitor of FIG. 5.

Meanwhile, the filtering element may consist of a polygonal capacitor. For example, it may be of a rectangular shape as shown in FIGS. 9*a* and 9*b*, or it may be a stacked type capacitor as shown in FIGS. 10*a* and 10*b*.

Meanwhile, the angular capacitor may consist of a plurality of capacitors, and in the case where a plurality of capacitors are provided, the dielectric constants of the ceramic stocks of the capacitors may be same to one another, or they may be different from one another.

Further, in order to prevent the epoxy resin 24 from flowing out during its injection, the lead-through type filter 20 includes a tubular insulator 26 within the entrance of the case 25.

In the case 25, a stepped portion is formed within the large diameter interior space of the case 25 along the corner portion of the small diameter interior space, so that the central conductive line 21 can be prevented from being short-circuited with the other end electrode of the connected element. This short-circuit preventing stepped portion may consist of an insulator or an inductor.

Figure 7:
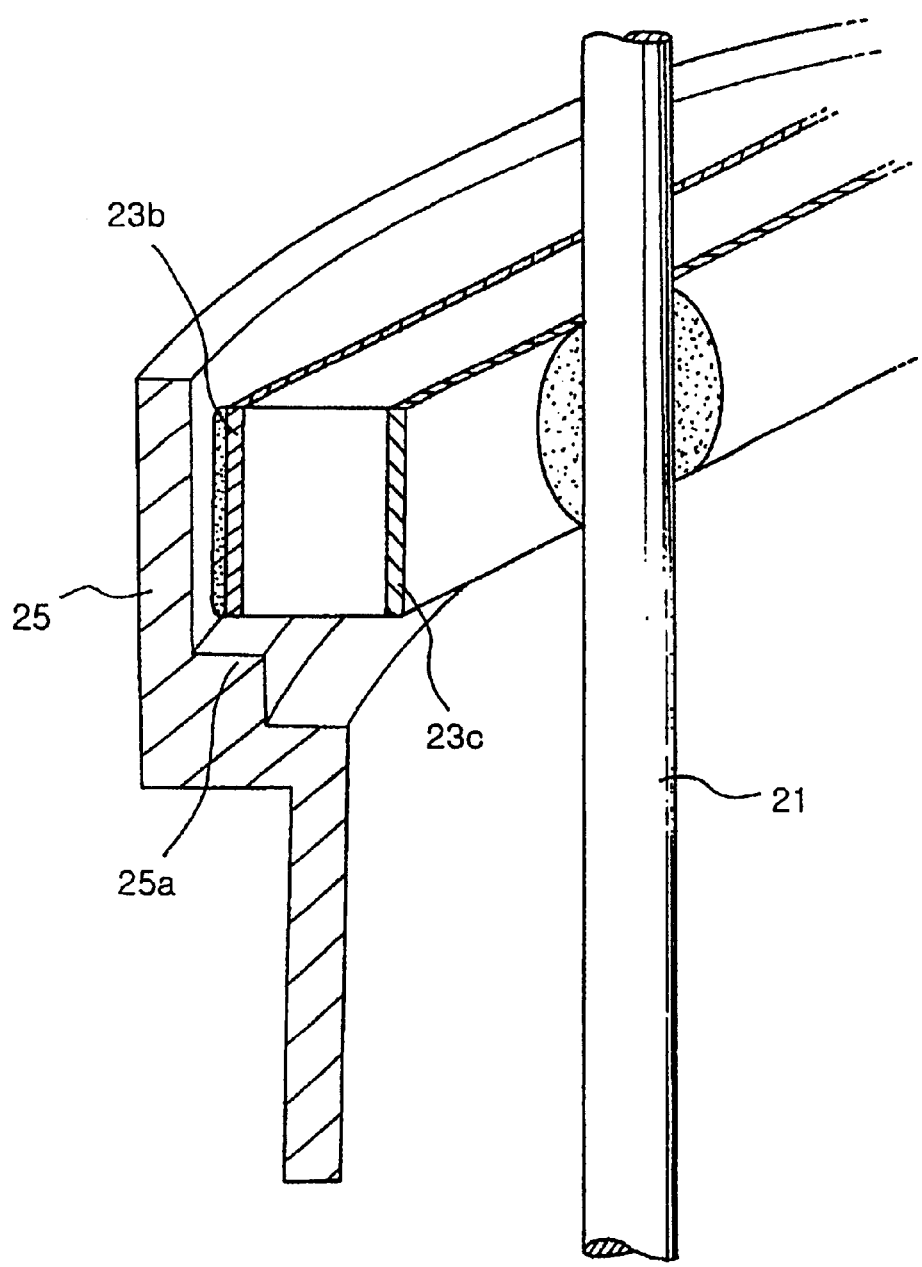
FIG. 7 is a partly cut-out view of the filter of FIG. 5.
Figure 8:
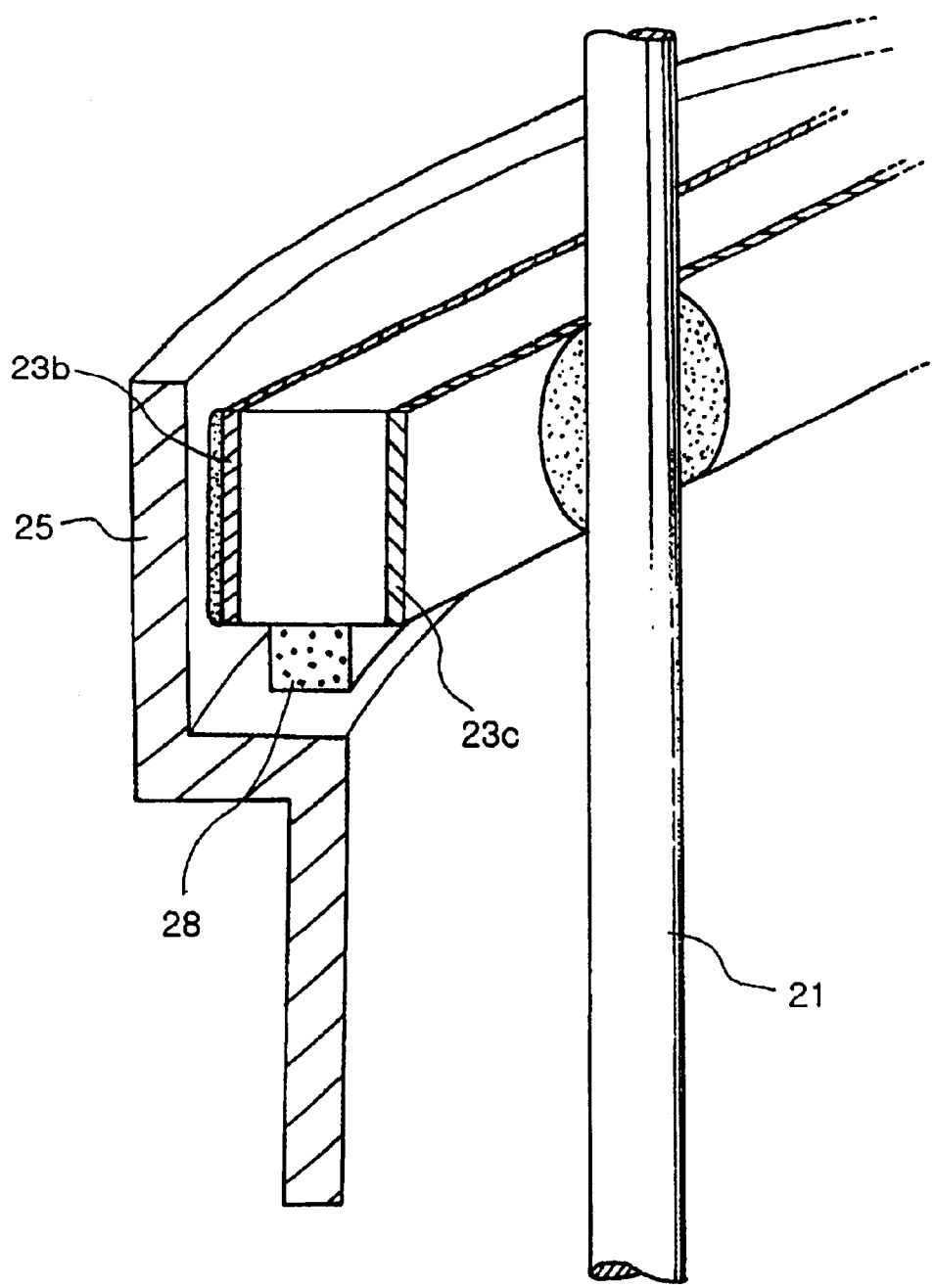
FIG. 8 is a partly cut-out view showing another internal structure of the filter of FIG. 5.

FIG. 7 is a partly cut-out view of the filter of FIG. 5. FIG. 8 is a partly cut-out view showing another internal structure of the filter of FIG. 5. Referring to FIG. 7, a stepped portion 25*a* is formed within the large diameter interior space of the case 25 along the corner portion of the small diameter interior space, so that the inside of the case 25 can be prevented from being short-circuited with one electrode 23*b* of the angular capacitor 23. This stepped portion may be formed integrally with the case 25 during its manufacture, or a separate short-circuit preventing insulator piece 28 may be inserted into the case 25 after its manufacture as shown in FIG. 8. As shown in FIG. 8, the short-circuit preventing insulator piece 28 may be made of any kind of insulator, or may be an insulating inductor. In the case where an inductor is used, the required short-circuit prevention is ensured, and at the same time, it serves as an additional inductor, so that the filter may act as a wide band filter.

The capacitor 23 is a simple angular type, and therefore, it does not require a die unlike in the conventional method. Further, it does not have a special geometric contour, and therefore, its manufacture is easy in view of the thickness and area managements. Further, the area of the bypassing ground terminal electrode is almost same as the area of the dc line terminal electrode, with the result that the errors are minimized. Accordingly, defective products are almost eliminated. Further, the angular capacitor 23 has a thickness larger than that of the thick and thin portions of the conventional lead-through type capacitor, and therefore, the voltage withstanding capability is superior in the relative terms.

In forming the lead-through type capacitor, if one or more of the tubular insulator is inserted into between the cylindrical ground terminal and the central terminal, the insulation between the two terminals are strengthened, and the workability is improved during the injection of the epoxy resin.

As described above, the lead-through type filter having angular elements according to the present invention includes at least one angular capacitor, and at least one inductor additionally. The diversified modifications of the present invention will be described below, and in all of these modified examples of the lead-through type filter, the electrical connection method and the manufacturing processes are same. Only, the position and the number of the inductors and capacitors are modified, and thus, a π type, T type and LC noise filters can be embodied.

FIG. 9*a* is a side view of the angular capacitor of FIG. 5. FIG. 9*b* is a perspective view of the angular capacitor of FIG. 5. Referring to FIGS. 9*a* and 9*b*, the angular capacitor 23 which is accommodated within the case 25 of the lead-through type filter 20 is manufactured in the following manner. That is, a wafer of a ceramic stock 23*a* having a proper thickness is prepared. Then electrodes 23*b* and 23*c* are formed on the top and bottom of the ceramic stock, and then, the wafer is cut into pieces such that they can be respectively accommodated within the case, and that they would have the required capacitance respectively. Alternatively, the angular capacitors 23 may be manufactured individually, and thus, the manufacturing method for the angular capacitor is not limited at any case. Meanwhile, the lead-through type filter of FIG. 5 acts as an LC low pass filter as shown in the equivalent circuit of FIG. 11.

FIG. 10*a* is a side view of the stacked type capacitor of FIG. 5. FIG. 10*b* is a perspective view of the stacked type capacitor of FIG. 5. Referring to FIGS. 10*a* and 10*b*, the angular capacitor 23 which is accommodated within the case 25 of the lead-through type filter 20 may be a ceramic capacitor or a multi-layer capacitor, i.e., a stacked type capacitor.

Figure 12A:
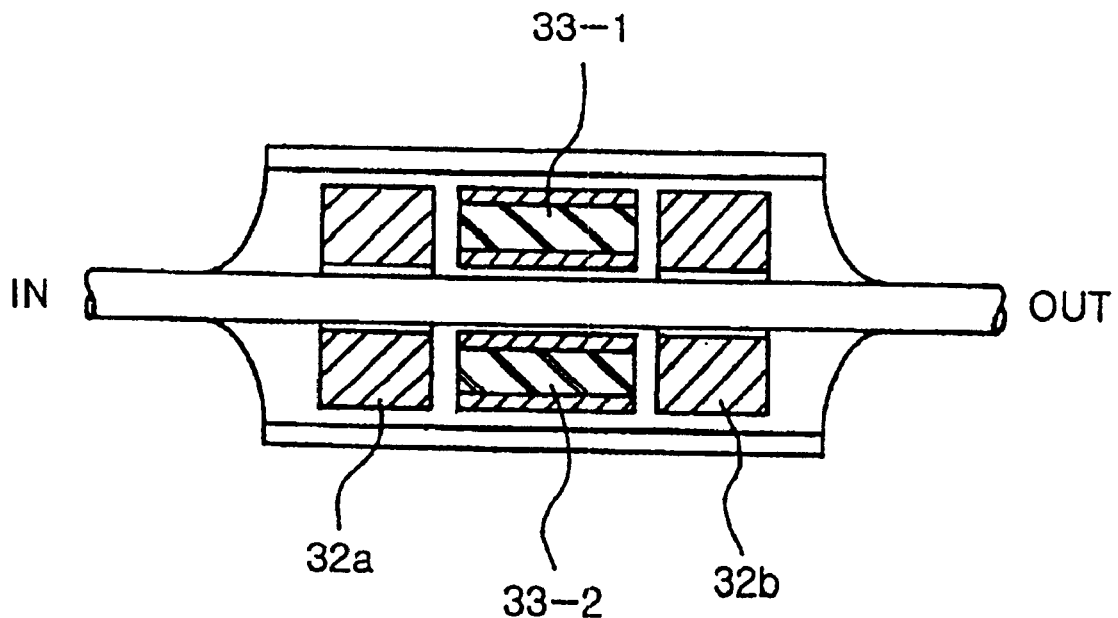
FIG. 12a illustrates a first modified example of the first embodiment of FIG. 5.
Figure 12B:
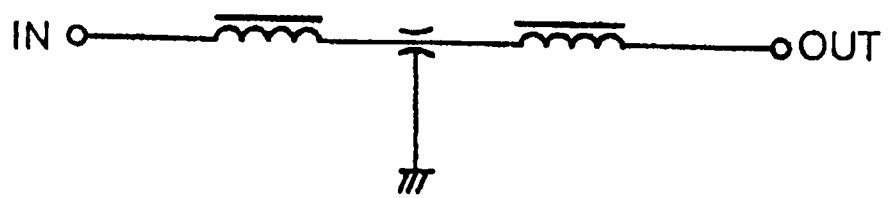

FIG. 12*a* illustrates a first modified example of the first embodiment of FIG. 5. FIG. 12*b* is an equivalent circuit of FIG. 12a. Referring to FIG. 12a, the first modified example of the first embodiment of the lead-through type filter includes: two lead-through type inductors 32a and 32b; and two angular capacitors 33-1 and 33-2 disposed between the two inductors 32a and 32b. The lead-through type filter of FIG. 12a acts as a T type noise filter in which the angular capacitors 33-1 and 33-2 are disposed at the center, and the inductors 32a and 32b are disposed at the both sides of the former as shown in FIG. 12b.

Figure 13A:
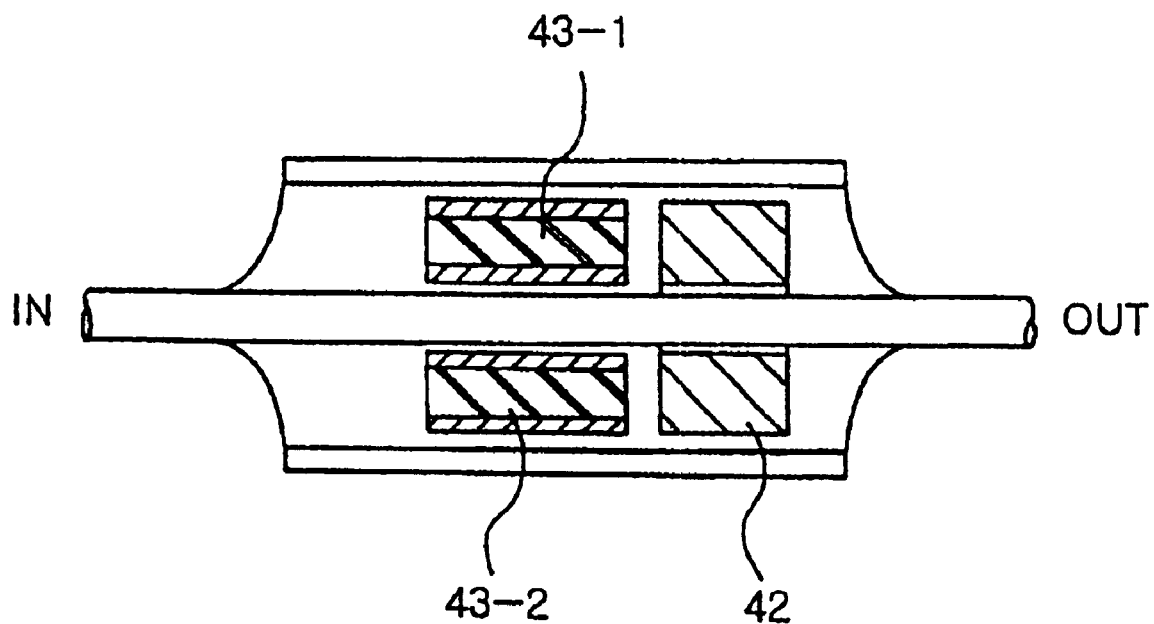
FIG. 13a illustrates a second modified example of the first embodiment of FIG. 5.
Figure 13B:
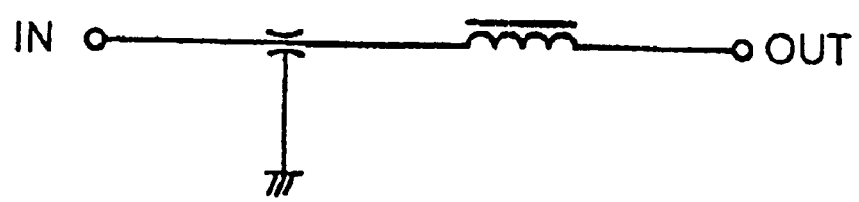

FIG. 13a illustrates a second modified example of the first embodiment of FIG. 5. FIG. 13b is an equivalent circuit of FIG. 13a. Referring to FIG. 13a, the lead-through type filter as the second modified example of the first embodiment includes: one lead-through type inductor 42; and two angular capacitors 43-1 and 43-2 disposed at a side of the inductor 42. The lead-through type filter of FIG. 13a acts as a wide band LC noise filter in which the inductor 42 is disposed at a side of the angular capacitors 43-1 and 43-2 as shown in FIG. 13b.

Figure 14A:
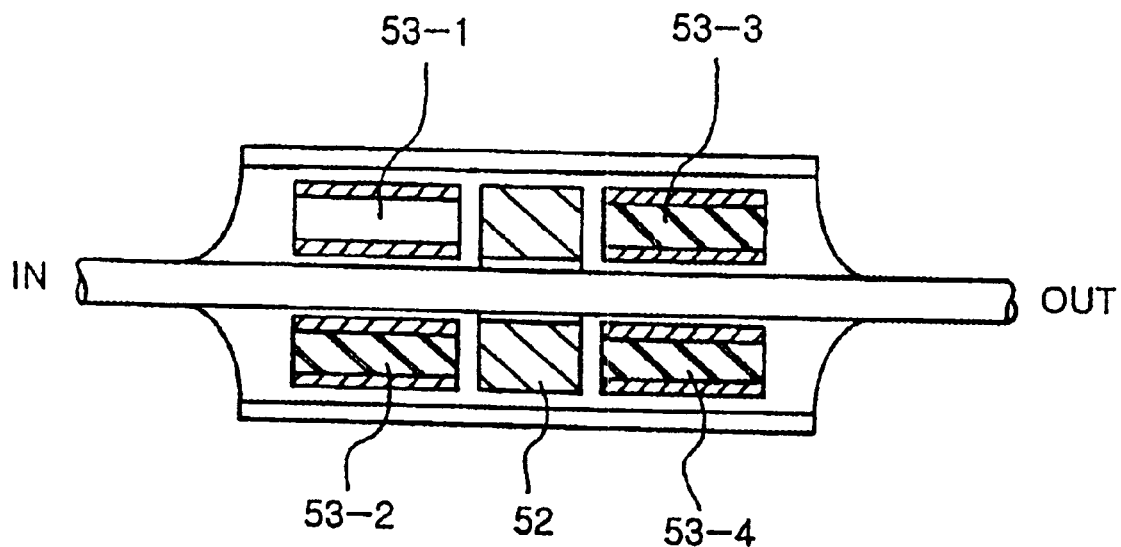
FIG. 14a illustrates a third modified example of the first embodiment of FIG. 5.
Figure 14B:
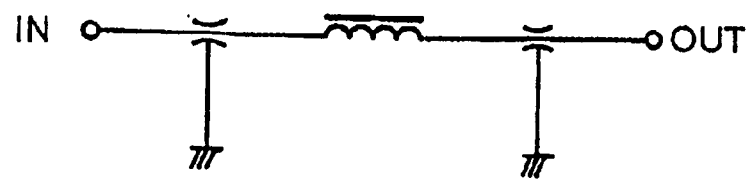

FIG. 14a illustrates a third modified example of the first embodiment of FIG. 5. FIG. 14b is an equivalent circuit of FIG. 14a. Referring to FIG. 14a, the lead-through type filter as the third modified example of the first embodiment includes: one lead-through type inductor 52; and four angular capacitors 53-1 to 53-4. The lead-through type filter of FIG. 14a acts as a π type noise filter in which the capacitors 53-1 and 53-2 are disposed at a side of the inductor 52, and the capacitors 53-3 and 53-4 are disposed at another side of the inductor 52 as shown in FIG. 14b.

Figure 15A:
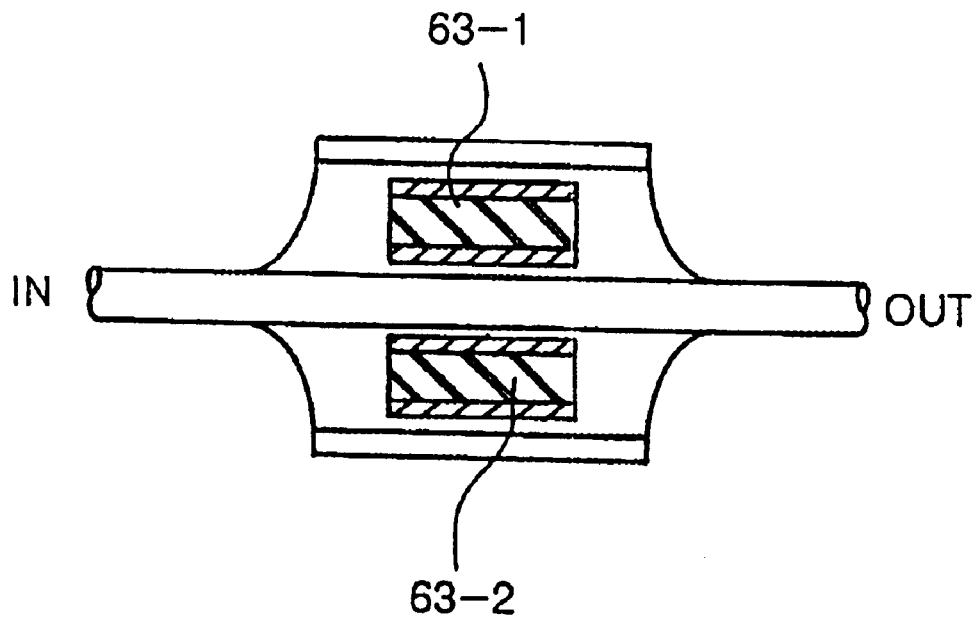
FIG. 15a illustrates a fourth modified example of the first embodiment of FIG. 5.
Figure 15B:
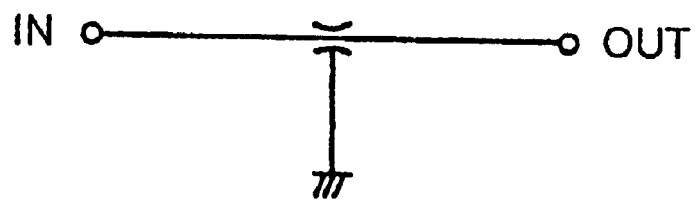

FIG. 15a illustrates a fourth modified example of the first embodiment of FIG. 5. FIG. 15b is an equivalent circuit of FIG. 15a. Referring to FIG. 15a, the lead-through type filter as the fourth modified example of the first embodiment includes only two angular capacitors 63-1 and 63-2. This filter acts as a high band LC noise filter.

Figure 16:
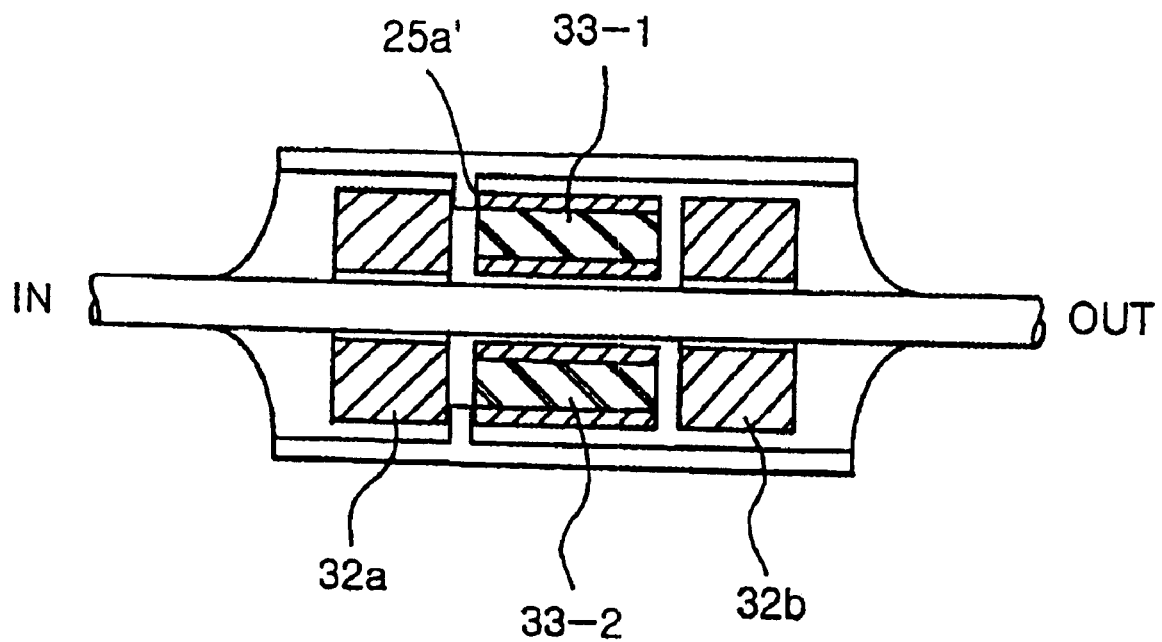
FIG. 16 illustrates still another modified example of the filter of FIG. 12.

FIG. 16 illustrates still another modified example of the filter of FIG. 12. Referring to FIG. 16, the lead-through type filter as still another modified example of FIG. 12 includes: two angular capacitors 33-1 and 33-2; and two inductors 32a and 32b, each being disposed at a side of the two angular capacitors 33-1 and 33-2. An annular projection is formed between the inductor 32a and the capacitors 33-1 and 33-2, and therefore, the workability of inserting to the elements into case is improved.

Figure 17:
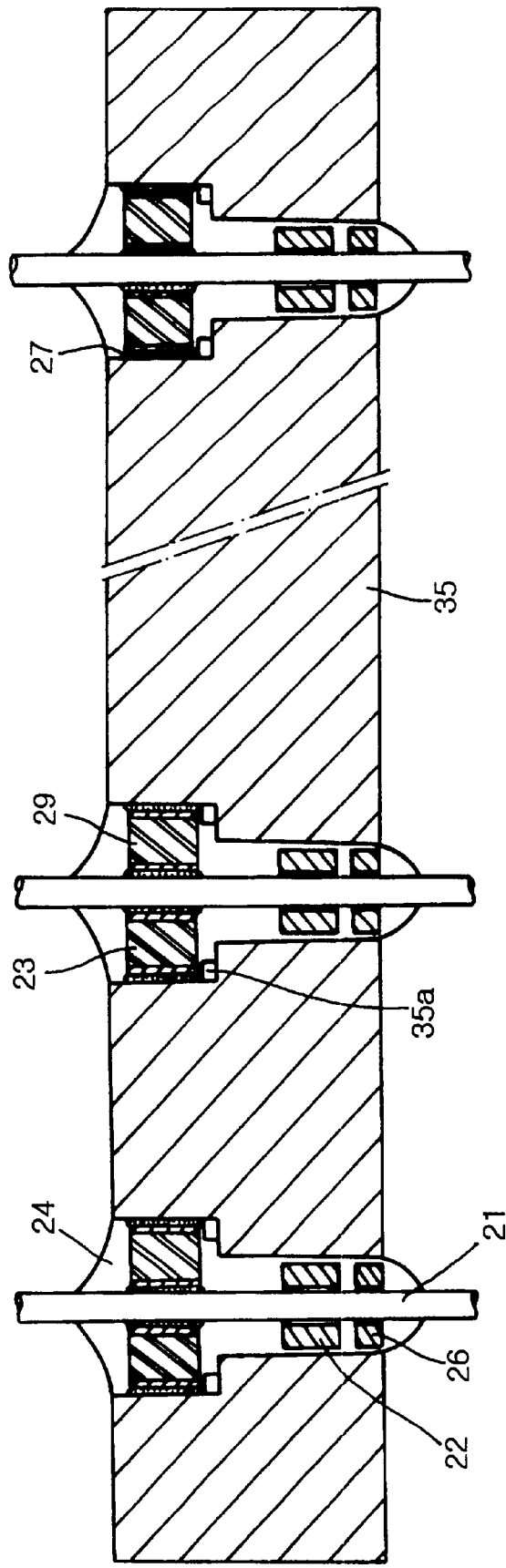
FIG. 17 is a sectional view showing a second embodiment of the lead-through type filter according to the present invention.
Figure 18:
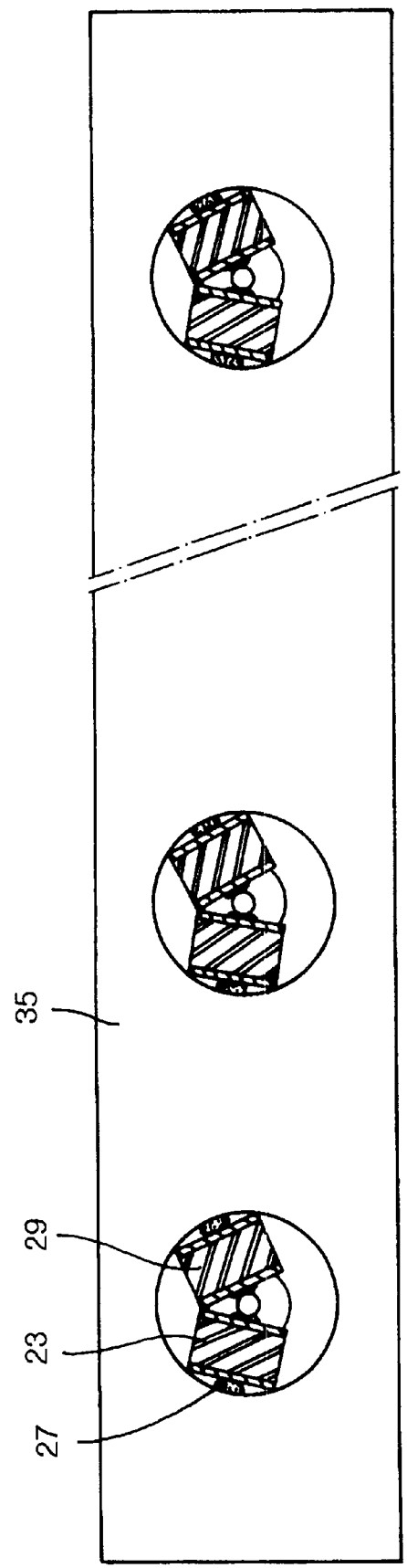
FIG. 18 is a plan view of FIG. 17.

FIG. 17 is a sectional view showing a second embodiment of the lead-through type filter according to the present invention. FIG. 18 is a plan view of FIG. 17. Referring to FIGS. 17 and 18, the lead-through type filter having angular elements according to the present invention includes: a multi-case having accommodating rooms for at least two elements and to be served as an external ground terminal; a central conductor line 21 for supplying a dc power; at least one angular filtering element having an angular ceramic stock, an electrode being formed on one face of the ceramic stock and being electrically connected to an inside of the accommodating room of the multi-case, and another electrode being formed on another face of the ceramic stock and being electrically connected to the central conductive line 21; and an epoxy resin layer filled into the multi-case.

The multi-case includes a large diameter interior space, and a small diameter interior space. A filtering element which is accommodated within the large diameter interior space of the multi-case is an angular ceramic stock 23a. A one side electrode 23b is attached on one face of the ceramic stock and is electrically connected to the inside of the multi-case. Another side electrode 23c is attached to another face of the ceramic stock and is electrically connected to the central conductive line 21. Thus within the large diameter interior space of the case 25, there is accommodated at least one angular capacitor 23.

The filtering element is accommodated within the large diameter interior space of the multi-case. This filtering element which is accommodated within the large diameter interior space of the multi-case is an angular ceramic stock 29a. A one side electrode 29b is attached on one face of the ceramic stock and is electrically connected to the inside of the multi-case. Another side electrode 29c is attached to another face of the ceramic stock and is electrically connected to the central conductive line 21. Thus within the large diameter interior space of the multi-case 25, there is accommodated at least one angular varistor 29.

The filtering elements may include at least one angular capacitor and at least one angular varistor. Further, the lead-trough type filter may include a cylindrical ferrite magnetic body having an axial through hole, thereby forming at least one lead-through type inductor 22 which is accommodated within the small diameter interior space of the multi-case.

As described above, in this second embodiment of the present invention as an array type lead-through type filter, the contained elements and materials are same as those of the first embodiment. The different feature lies in the fact that one case including a plurality of cylindrical cases (multi-case) forms a plurality of filters. If the second embodiment is applied, the simplification of the manufacturing process, the curtailing of the manufacturing cost, the improvement of the workability, can be attained, thereby realizing a stronger competitiveness.

Figure 19:
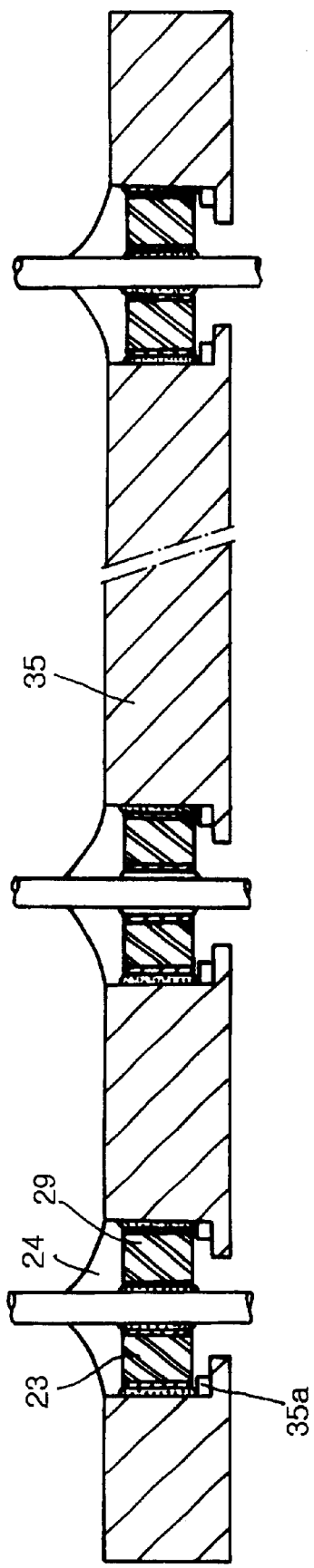
FIG. 19 illustrates a first modified example of the second embodiment of FIG. 17.

FIG. 19 illustrates a first modified example of the second embodiment of FIG. 17. Referring to FIG. 19, in order to reduce the thickness of the multi-case 35, the small diameter interior space is minimized.

Figure 20:
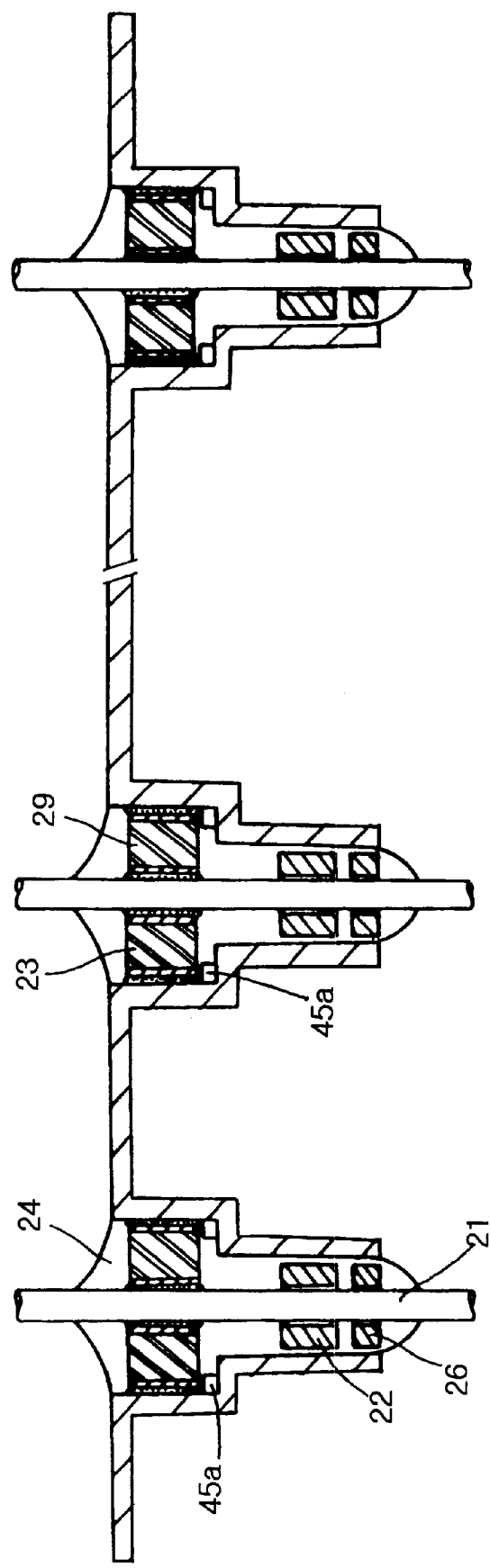
FIG. 20 illustrates a second modified example of the second embodiment of FIG. 17.

FIG. 20 illustrates a second modified example of the second embodiment of FIG. 17. Referring to FIG. 20, in order to facilitate the formation of the multi-case 45, the thickness of the multi-case is made thin, and a plurality of element accommodating rooms are formed, thereby realizing array type lead-through type filters.

Figure 21:
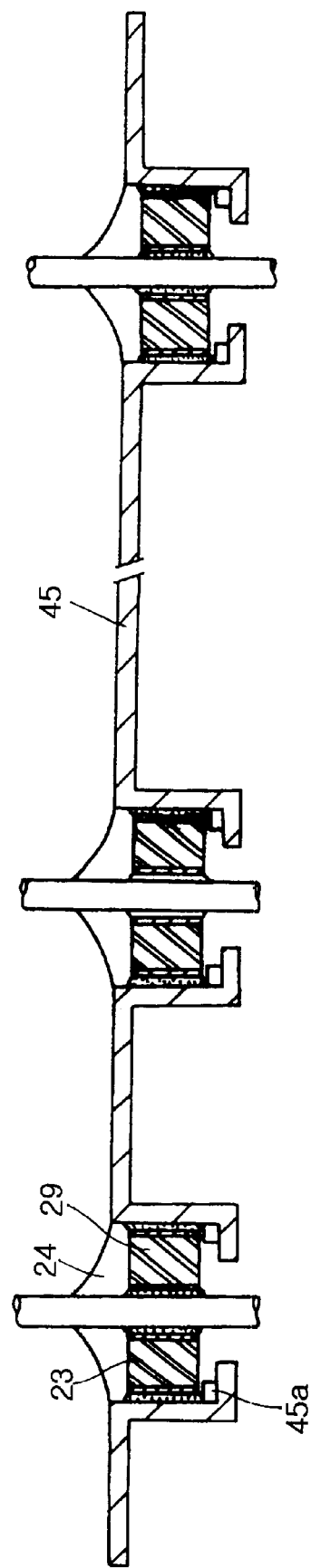
FIG. 21 illustrates a third modified example of the second embodiment of FIG. 17.

FIG. 21 illustrates a third modified example of the second embodiment of FIG. 17. Referring to FIG. 21, in order to reduce the thickness of the multi-case 45 of FIG. 20, the small diameter interior space is minimized or eliminated.

According to the present invention as described above, the capacitance control becomes easy by controlling the thickness or areas the elements during the manufacture of the lead-through type filter having the polygonal elements. Further, the withstanding against a surge is superior, and an easily manufactured polygonal capacitors are employed, so that noises can be effectively removed at the desired band. Further, the voltage withstanding characteristic is also superior.

The lead-through type filter having polygonal elements according to the present invention can be easily embodied into π type, T type, or LC noise filters in accordance with the sequence and method of arranging the inductors and capacitors between the ground terminal and the central terminal. Further, when arranging the polygonal elements within the case of the filter, the workability is improved.

Further, if one or more of tubular insulator is inserted into between the cylindrical ground terminal and the central terminal, the insulation between the ground terminal and the central terminal is strengthened, and the epoxy resin can be easily injected.

Particularly, the cylindrical filters can be manufactured in an array form, and therefore, the manufacturing process is simplified, as well as curtailing the manufacturing cost. Thus ultimately a superior competitive power can be secured.

In the above, the present invention was described based on the specific preferred embodiments and the attached drawings, but it should be apparent to those ordinarily skilled in the art that various changes and modifications can be added without departing from the spirit and scope of the present invention which will be defined in the appended claims.

What is claimed is:

1. A lead-through type filter having angular elements, comprising:
    a case to be used as an external grounding terminal;
    a central conductive line for supplying a dc power;
    at least one angular filtering element accommodated within said case and made of an angular ceramic stock, with one side electrode being attached on a face of said ceramic stock and being electrically connected to said case, and with another side electrode being attached on another face of said ceramic stock and being electrically connected to said central conductive line; and
    an epoxy resin layer filled into an interior of said case;
    wherein said case comprises a large diameter interior space and a small diameter interior space.

2. The lead-through type filter as claimed in claim 1, wherein said filtering element is accommodated within said large diameter interior space of said case; and
    said filtering element is an angular ceramic stock, one side electrode being attached on one face of said ceramic stock and being electrically connected to an inside of said case, another side electrode being attached to another face of said ceramic stock and being electrically connected to said central conductive line, thus accommodating at least one polygonal capacitor within said large diameter interior space of said case.

3. The lead-through type filter as claimed in claim 1, wherein said filtering element is accommodated within said large diameter interior space of said case; and
    said filtering element is an angular ceramic stock, one side electrode being attached on one face of said ceramic stock and being electrically connected to the inside of said case, another side electrode being attached to another face of said ceramic stock and being electrically connected to said central conductive line, thus accommodating at least one angular varistor within said large diameter interior space of said case.

4. The lead-through type filter as claimed in claim 1, wherein said filtering element consists of at least one polygonal capacitor and at least one varistor.

5. The lead-through type filter as claimed in claim 1, wherein said lead-through type filter further comprises at least one lead-through type inductor consisting of a cylindrical ferrite magnetic body with an axial through hole, said conductive line passing through said axial through hole, and said inductor being accommodated within said small diameter interior space of said case.

6. The lead-through type filter as claimed in claim 3, wherein said filtering element is a polygonal capacitor.

7. The lead-through type filter as claimed in claim 3, wherein said filtering element is rectangular.

8. The lead-through type filter as claimed in claim 2, wherein said polygonal capacitor consists of a plurality of capacitors; and the plurality of said capacitors respectively have ceramic stocks with a same dielectric constant.

9. The lead-through type filter as claimed in claim 2, wherein said polygonal capacitor consists of a plurality of capacitors; and the plurality of said capacitors respectively have ceramic stocks with different dielectric constants.

10. The lead-through type filter as claimed in claim 1, further comprising: a tubular insulator inserted into an entrance of said case so as to prevent the epoxy resin from flowing to an outside during a filling of the epoxy resin.

11. The lead-through type filter as claimed in claim 3, wherein a stepped portion is formed within said large diameter interior space of said case along said corner portion of said small diameter interior space, so as to prevent said central conductive line from being short-circuited with another end electrode of a connected element during an insertion of said filtering element.

12. The lead-through type filter as claimed in claim 11, wherein said stepped portion for prevention of a short circuit is an insulator.

13. The lead-through type filter as claimed in claim 12, wherein said stepped portion for prevention of a short circuit is an insulating inductor.

14. The lead-through type filter as claimed in claim 4, wherein said polygonal capacitor consists of a plurality of capacitors; and the plurality of said capacitors respectively have ceramic stocks with a same dielectric constant.

15. The lead-through type filter as claimed in claim 4, wherein said polygonal capacitor consists of a plurality of capacitors; and the plurality of said capacitors respectively have ceramic stocks with different dielectric constants.

16. A lead-through type filter having angular elements, comprising:
    a multi-case to be used as an external grounding terminal, wherein said multi-case has at least two element accommodating rooms, and each room has a large diameter interior space and a small diameter interior space;
    a central conductive line for supplying a dc power;
    at least one angular filtering element made of an angular ceramic stock, with one side electrode being attached on a face of said ceramic stock and being electrically connected to said element accommodating rooms of said multi-case, and with another side electrode being attached on another face of said ceramic stock and being electrically connected to said central conductive line, so as to be accommodated within said element accommodating rooms of said multi-case; and
    an epoxy resin layer filled into an interior of said multi-case.

17. The lead-through type filter as claimed in claim 16, wherein said filtering element is accommodated within said large diameter interior space of said multi-case; and
    said filtering element is an angular ceramic stock, one side electrode being attached on one face of said ceramic stock and being electrically connected to an inside of said multi-case, another side electrode being attached to another face of said ceramic stock and being electrically connected to said central conductive line, thus accommodating at least one polygonal capacitor within said large diameter interior space of said multi-case.

18. The lead-through type filter as claimed in claim 16, wherein said filtering element is accommodated within said large diameter interior space of said multi-case; and
    said filtering element is an angular ceramic stock, one side electrode being attached on one face of said ceramic stock and being electrically connected to the inside of said multi-case, another side electrode being attached to another face of said ceramic stock and being electrically connected to said central conductive line, thus accommodating at least one angular varistor within said large diameter interior space of said multi-case.

19. The lead-through type filter as claimed in claim 16, wherein said filtering element consists of at least one polygonal capacitor and at least one varistor.

20. The lead-through type filter as claimed in claim 16, further comprising at least one lead-through type inductor consisting of a cylindrical ferrite magnetic body with an axial through hole, said conductive line passing through said axial through hole, and said inductor being accommodated within said small diameter interior space of said multi-case.

21. The lead-through type filter as claimed in claim 16, further comprising: a tubular insulator inserted into an entrance of said multi-case so as to prevent the epoxy resin from flowing to an outside during a filling of the epoxy resin.

22. The lead-through type filter as claimed in claim 17, wherein said filtering element is a polygonal capacitor.

23. The lead-through type filter as claimed in claim 17, wherein said filtering element is rectangular.

24. The lead-through type filter as claimed in claim 17, wherein said polygonal capacitor consists of a plurality of capacitors; and the plurality of said capacitors respectively have ceramic stocks with a same dielectric constant.

25. The lead-through type filter as claimed in claim 17, wherein said polygonal capacitor consists of a plurality of capacitors; and the plurality of said capacitors respectively have ceramic stocks with different dielectric constants.

26. The lead-through type filter as claimed in claim 17, wherein a stepped portion is formed within said large diameter interior space of said multi-case along said corner portion of said small diameter interior space, so as to prevent said central conductive line from being short-circuited with another end electrode of a connected element during an insertion of said filtering element.

27. The lead-through type filter as claimed in claim 26, wherein said stepped portion for prevention of a short circuit is an insulator.

28. The lead-through type filter as claimed in claim 27, wherein said stepped portion for prevention of a short circuit is an insulating inductor.

29. The lead-through type filter as claimed in claim 19, wherein said polygonal capacitor consists of a plurality of capacitors; and the plurality of said capacitors respectively have ceramic stocks with a same dielectric constant.

30. The lead-through type filter as claimed in claim 19, wherein said polygonal capacitor consists of a plurality of capacitors; and the plurality of said capacitors respectively have ceramic stocks with different dielectric constants.

* * * * *